United States Patent [19]

Sukeda et al.

[11] Patent Number: 4,459,680
[45] Date of Patent: Jul. 10, 1984

[54] MAGNETIC BUBBLE MEMORY CASSETTE

[75] Inventors: Toshiaki Sukeda, Nagano; Shiro Naoi, Suzaka; Harumi Maegawa, Kawasaki, all of Japan

[73] Assignee: Fujitsu Limited, Kawasaki, Japan

[21] Appl. No.: 315,879

[22] Filed: Oct. 28, 1981

[30] Foreign Application Priority Data

Oct. 30, 1980 [JP] Japan .................... 55-155135[U]

[51] Int. Cl.³ .................................................. G11C 19/08
[52] U.S. Cl. ........................................................ 365/1
[58] Field of Search ....................................... 365/1, 2

[56] References Cited

FOREIGN PATENT DOCUMENTS

| 147443 | 12/1978 | Japan | 365/1 |
| 43427 | 4/1979 | Japan | 365/2 |
| 154942 | 12/1979 | Japan | 365/2 |

OTHER PUBLICATIONS

IBM Technical Disclosure Bulletin–vol. 22, No. 1, Jun. 1979; p. 73.

Primary Examiner—James W. Moffitt
Attorney, Agent, or Firm—Staas & Halsey

[57] ABSTRACT

A magnetic bubble memory device of a cassette type including at least one magnetic bubble memory chip, a package for accommodating the chip and upper and lower cases. In the magnetic bubble memory device, two magnetic shield plates are fixed to the inner surfaces of the upper and lower cases, respectively.

13 Claims, 13 Drawing Figures

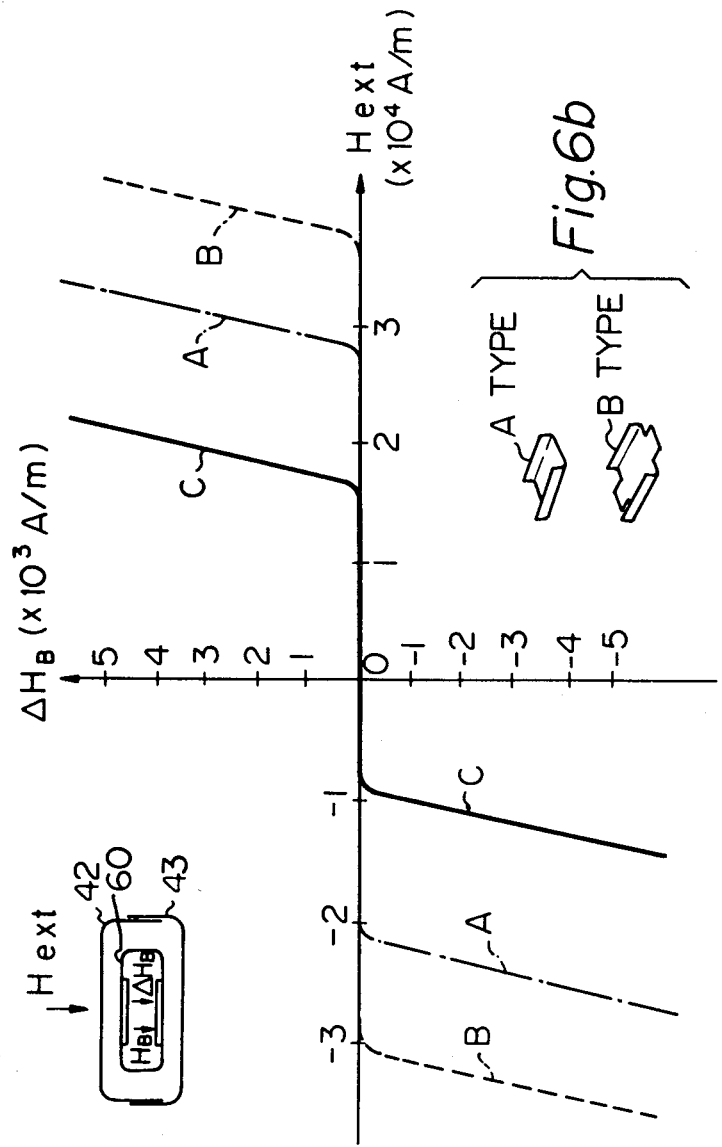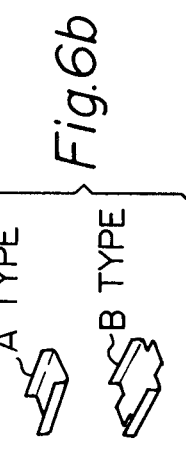

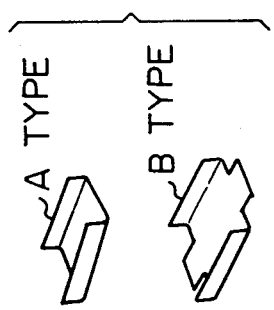
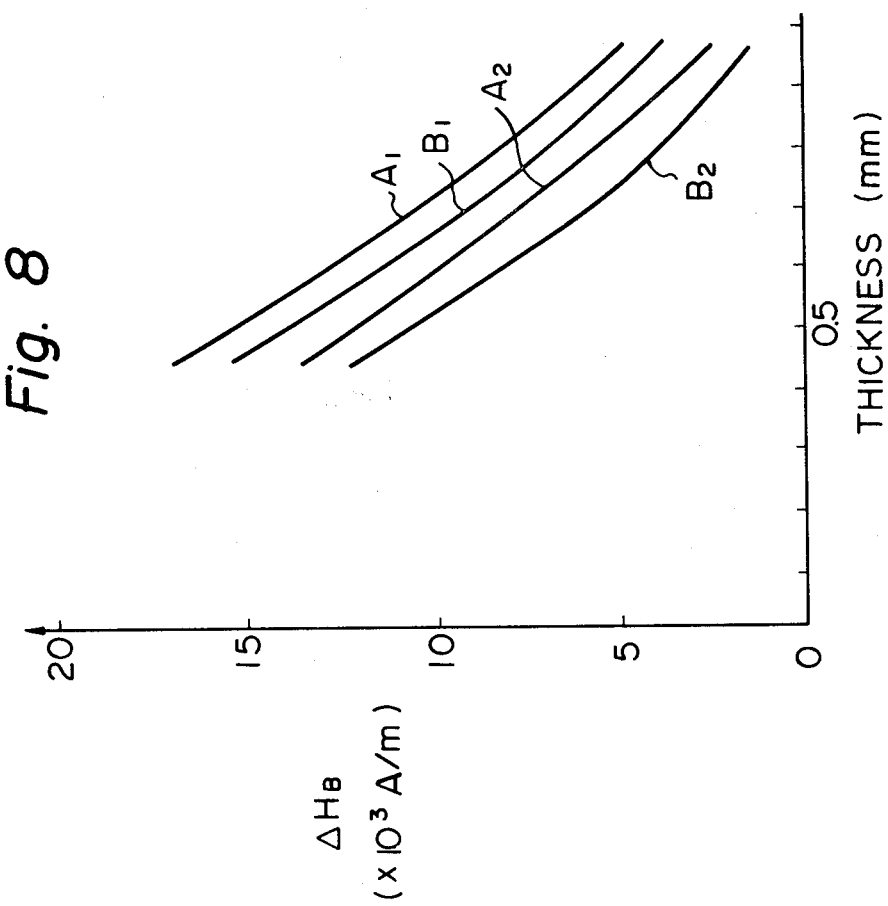

MAGNETIC BUBBLE MEMORY CASSETTE

BACKGROUND OF THE INVENTION

The present invention relates to a magnetic bubble memory device of a cassette type, which serves as a portable data recorder.

In general, in a non-volatile large-capacity memory device, high reliability is necessary for storing and holding a large quantity of information. Although a magnetic tape device or magnetic disk device is non-volatile, it has a fatal disadvantage in that it involves movable parts. Therefore, these memory devices, even though they are non-volatile large-capacity memory devices, do not have high reliability.

In recent years, a magnetic bubble memory device has been widely used as a non-volatile large-capacity memory device having a high reliability. In particular, since a cassette-type magnetic bubble memory device (hereinafter, referred to as a cassette) is small in size and weight, the cassette can serve as a portable data recorder and be used for entering data in a computer. The cassette is freely mounted and demounted in a cassette body device having a driving circuit, a read-out circuit, a bubble control circuit and the like.

Since the cassette is a kind of magnetic memory, the bubble information stored in the cassette may be destroyed when subjected to an external magnetic noise field. For this purpose, a magnetic bubble memory chip is protected by a shield case, so that the bubble information is not destroyed even when subjected to an external magnetic noise field whose strength is 4000 to 20000 A/m (amperes per meter). In addition, a space between the shield case and the cassette case is always provided, so as to create a magnetic shield effect. However, just a shield case and a space is not enough, and accordingly, it is necessary to provide additional means for protecting against strong external noise magnetic fields to which a cassette may be subjected.

SUMMARY OF THE INVENTION

Therefore, it is an object of the present invention to provide a magnetic bubble memory device of a cassette type with additional means of protection against strong external magnetic noise fields.

It is another object of the present invention to provide a magnetic bubble memory device of a cassette type with good heat dissipating means to obtain a good bias margin.

It is still another object of the present invention to provide a magnetic bubble memory device with means for preventing electrostatic destruction of bubble information.

According to the present invention, there is provided a magnetic bubble memory device of a cassette type including at least one magnetic bubble memory chip, coils, surrounding the magnetic bubble memory chip, for generating a rotating magnetic field for the magnetic bubble memory chip, and permanent magnets, opposed to each other, for generating a bias magnetic field for the magnetic bubble memory chip. The device also includes a package for accommodating the magnetic bubble memory chip, the coils and the permanent magnets, and a printed board for mounting the package. Additionally included are upper and lower cases which are combined so as to accommodate the printed board mounting the package, and two magnetic shield plates fixed to the inner faces of the upper and lower cases, respectively.

The present invention will be more clearly understood from the following description with reference to the attached drawings.

BRIEF DESCRIPTION OF THE DRAWINGS

FIG. 6, including FIGS. 6a and 6b is a graph illustrating experimental result;

FIG. 8, including FIG. 8a is a graph illustrating experimental results obtained by using the standard permanent magnet 71 of FIG. 7;

DESCRIPTION OF THE PREFERRED EMBODIMENTS

Figure 1:
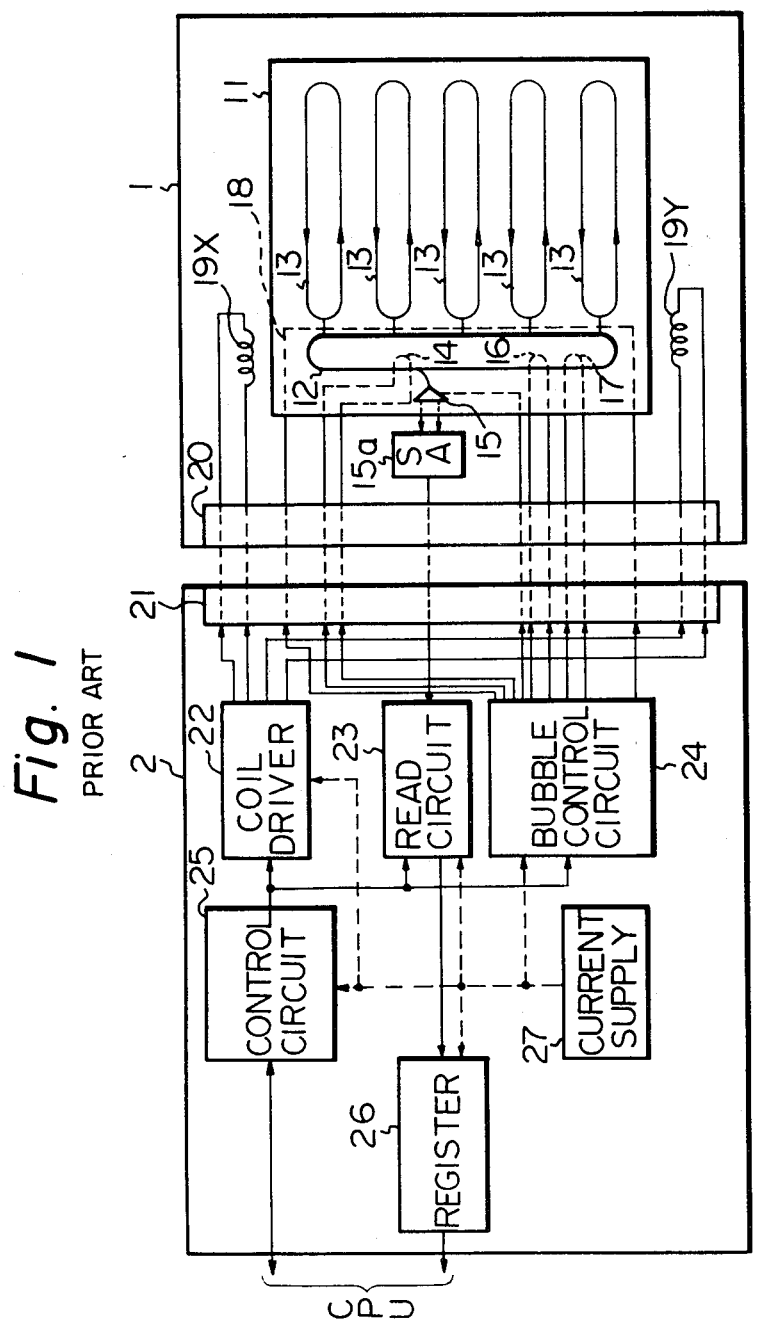
FIG. 1 is a circuit diagram illustrating a general cassette-type magnetic bubble memory system.

In FIG. 1, which illustrates a prior art general cassette-type magnetic bubble memory system, 1 is a cassette-type magnetic bubble memory device, that is, a cassette; and 2 is a cassette body device. In this case, the cassette 1 is freely mounted or demounted in the cassette body device via connectors 20 and 21.

In the cassette 1, 11 is a magnetic bubble memory chip comprising a major loop 12 acting as an information line, minor loops 13 acting as information storage loops, a replicator 14, a detector 15, an eraser 16, a generator 17 and a transmission control conductor pattern 18. 15a is a sense amplifier for sensing the output signal produced by the detector 15. 19X and 19Y are coils for generating a rotating magnetic field to transfer magnetic bubbles. Actually, the coils 19X and 19Y which are orthogonal to each other are wound on the magnetic bubble memory chip 11. In addition, permanent magnets (shown in the FIG. 5 embodiment of the present invention) are provided to generate a bias magnetic field.

On the other hand, in the body device 2, 22 is a coil driver circuit for driving the coils 19X and 19Y of the cassette 1 by supplying a sine-wave or rectangular-wave current; 23 is a read circuit which is connected to the sense amplifier 15a of the cassette 1; 24 is a bubble control circuit for the replicator 14, the eraser 16, the generator 17 and the transmission control conductor pattern 18. In more detail, the bubble control circuit 24 comprises: a circuit for supplying a current to the replicator 14 so as to split a magnetic bubble; a circuit for supplying a current to the detector 15 to detect the presence of a magnetic bubble; a circuit for supplying a current to the eraser 16 to erase an unnecessary magnetic bubble; and a circuit for supplying a current to the generator 17 to generate a magnetic bubble. 25 is a control circuit for controlling the coil driver circuit 22, the read circuit 23 and the bubble control circuit 24 based upon indication signals from a central processing unit (CPU) (shown in the FIG. 5 embodiment of the present invention). 26 is a register and 27 is a current supplying circuit for the circuits 22, 23, 24 and 25 and the register 26. By using this system of FIG. 1, the cassette 1 which is relatively small in size and weight is connected to the body device 2 via the connectors 20 and 21 as the occasion demands.

Figure 2:
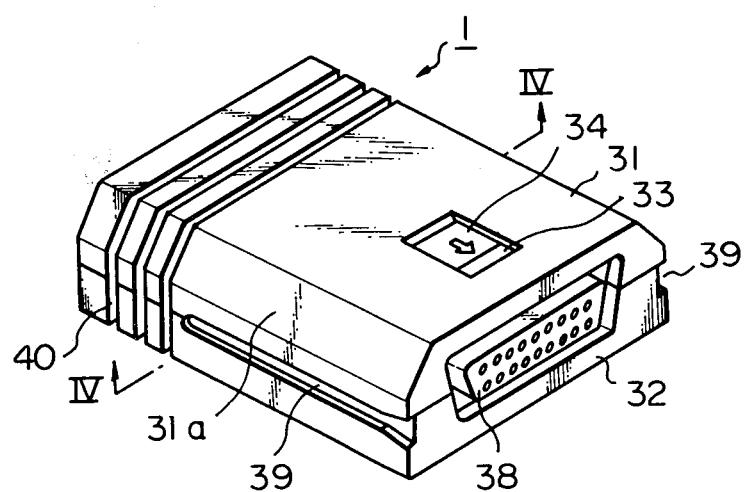
FIG. 2 is a perspective view illustrating an embodiment of the cassette-type magnetic bubble memory device according to the present invention.
Figure 3:
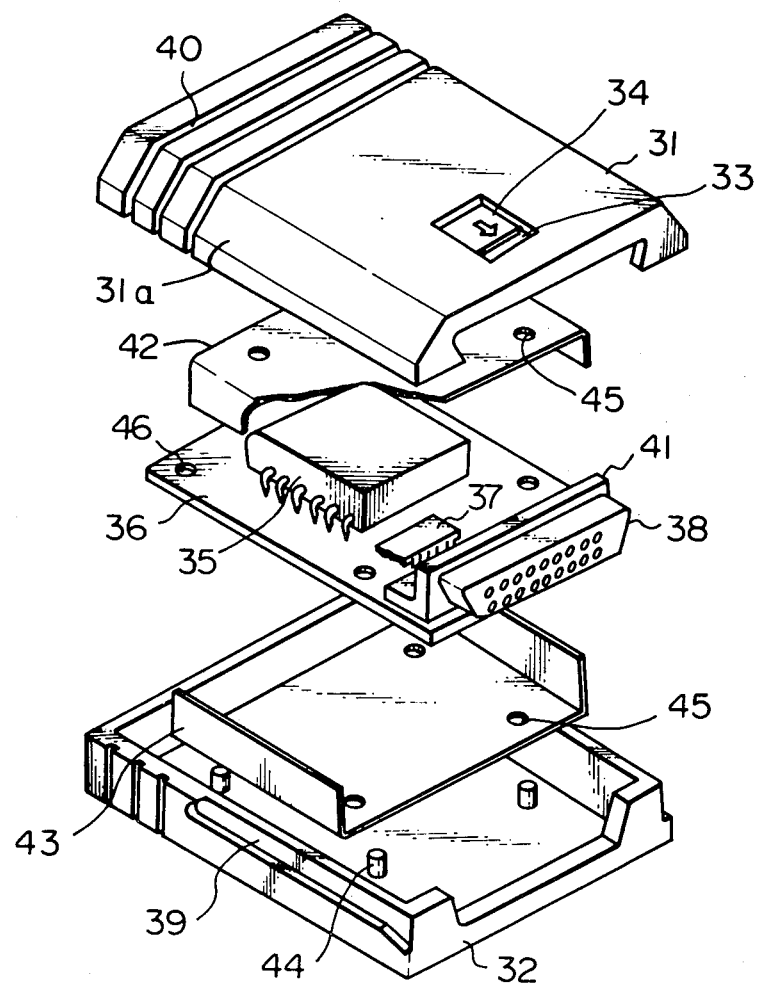
FIG. 3 is an exploded perspective view of the device of FIG. 2.

FIG. 2 is a perspective view illustrating an embodiment of the cassette-type magnetic bubble memory device (cassette) according to the present invention and FIG. 3 is an exploded perspective view of the device of FIG. 2. In FIGS. 2 and 3, 31 and 32 are molded upper and lower cases, respectively. In this design, the outer surface 31a of the upper case 31 is asymmetric and has large chamfers to prevent the cassette 1 from being turned upside down and incorrectly inserted into the cassette body device 2 (FIG. 1). 33 is a recess; 34 is a slide plate located slidably within the recess 33 for inhibiting the write operation; 35 is a package for accommodating a magnetic bubble memory chip (shown in FIG. 5) and the like which will be explained in more detail later; 36 is a printed board on which the package 35 and an IC package 37 serving as the sense amplifier 15a (FIG. 1) are mounted; and 38 is a connector. In this case, the connector 38 is female, so that fingers or the like can not come directly into contact with the pins, to prevent electrostatic destruction of the IC package 37. 39 are grooves for preventing a wrong cassette from being inserted into the body device 2 (FIG. 1). In this case, the widths of the two grooves 39 on both sides are different from each other. Further, 40 are grooves to prevent the cassette 1 from sliding at an undesired time and to facilitate the mounting or demounting of the cassette 1 into the cassette body device 2 (FIG. 1), and 41 is a base for mounting the connector 38.

It should be noted that the package 35 includes a shield case (shown in the FIG. 5 embodiment of the present invention) therein. However, just a shield case is not enough to prevent damage from a strong external magnetic noise field to which the magnetic bubble memory chip (shown in the FIG. 5 embodiment of the present invention) may be subjected.

According to the present invention, there are provided magnetic shield plates 42 and 43 which are made of a permalloy, that is, a ferromagnetic material having a high permeability, or pure iron.

The magnetic shield plates 42 and 43 have schematically U-shaped cross-sections. When the upper case 31 and the lower case 32 are combined, the spacing between the inner face of the upper case 31 and the package 35 is at least 3 mm, while the spacing between the printed board 36 and the lower case 32 is also at least 3 mm. Between such spacings, the magnetic shield plates 42 and 43 are present.

The magnetic shield plate 42 (or 43) is mounted on the inner face of the upper case 31 (or lower case 32) by inserting salient portions 44 (not shown in the upper case 31, but shown in the lower case 32) into apertures 45 of the magnetic shield plate 42 (or 43) and by heat caulking the protruding portions of the salient portions 44. In addition, apertures 46 of the printed board 36 are fitted and fixed to the salient portions 44 of the lower case 32.

Figure 4:
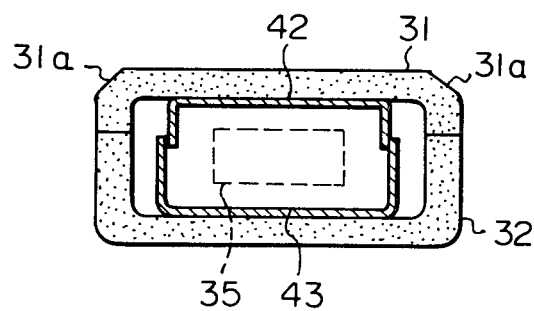
FIG. 4 is a cross-sectional view taken along the lines IV—IV in FIG. 2.

As illustrated in FIG. 4, which is a cross-sectional view taken along the lines IV—IV of FIG. 2, the magnetic shield plates 42 and 43 are superposed and overlapped at the ends thereof, which causes an excellent magnetic shield effect.

Figure 5:
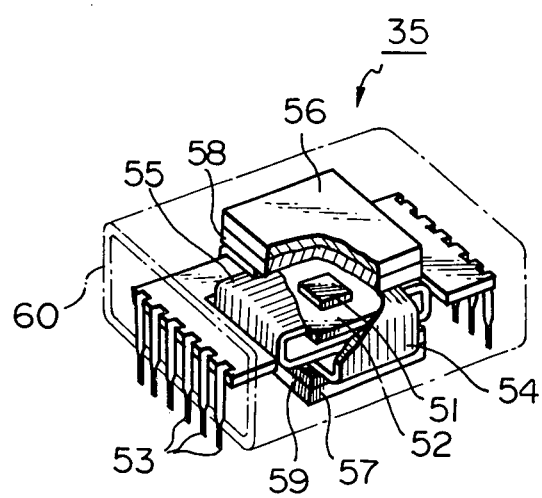
FIG. 5 is a partially cutaway view of the package 35 of FIG. 3.

FIG. 5 is a partially cutaway view of the package 35 of FIG. 3. In FIG. 5, a magnetic bubble memory chip 51 is mounted on an insulating substrate 52. External terminals of the magnetic bubble chip 51 are connected to lead terminals 53; 54 and 55 are coils in the X- and Y-directions, respectively, for generating a rotating magnetic field to move bubbles within the magnetic bubble memory chip 51; 56 and 57 are permanent magnets for generating a bias magnetic field to stabilize bubbles within the memory chip 51; 58 and 59 are magnetic field regulating plates; and 60 is a package which serves also as a magnetic shield case.

FIG. 6 is a graph showing the experimental results. In FIG. 6, the external magnetic field $H_{ext}$ appearing at the surface of the upper case 31 or the lower case 32 is shown in the ordinate, while fluctuation $\Delta H_B$ of the bias magnetic field $H_B$ ($H_B = 14000$ A/m) is shown in the abscissa. In FIG. 6, line A represents the characteristics of the cassette 1 with magnetic shield plates 42 and 43 of type A (permalloy (45Ni-Fe) of 0.5 mm thickness); line B represents the characteristics the cassette 1 with magnetic shield plates 42 and 43 of type B (pure iron of 0.3 mm thickness); and line C represents the characteristics the cassette 1 without magnetic shield plates 42 and 43. As is understood from FIG. 6, as compared with the prior art (line C), the present invention (lines A and B) exhibits an excellent magnetic shield effect.

Figure 7:
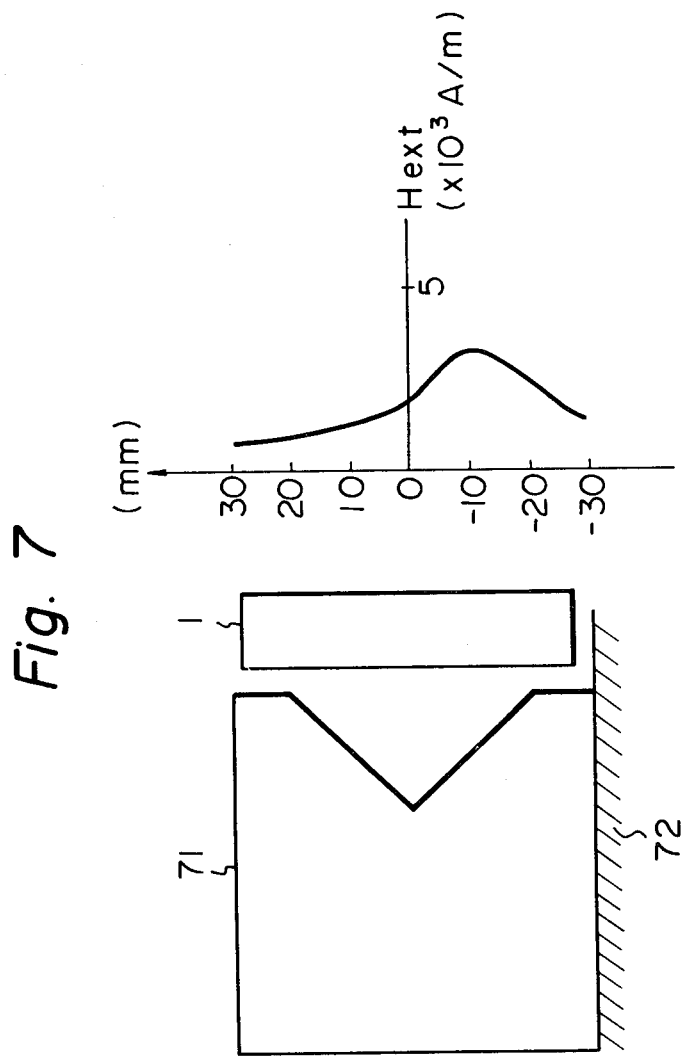
FIG. 7 is a graph illustrating an external magnetic field of a standard permanent magnet 71.

In addition, FIG. 7 is a graph showing an external magnetic field of a standard permanent magnet. In this case, the standard permanent magnet 71 is placed on an iron plate 72 and, in addition, the spacing between the standard permanent magnet 71 and the cassette 1 is about 5 mm and the spacing between the cassette 1 and the iron plate 72 is also about 5 mm. In this state, at the surface of the cassette 1 facing the standard permanent magnet 71, the distribution of the magnetic field is as shown in FIG. 7.

FIG. 8 is a graph showing the experimental results obtained by using the standard permanent magnet 71 of FIG. 7. In FIG. 8, the thickness of a magnetic shield plate is shown in the ordinate, while fluctuation $\Delta H_B$ of a bias magnetic field is shown in the abscissa. In addition, line $A_1$ represents the characteristics in the case where magnetic shield plates (type A) made of a permalloy are used; line $B_1$ represents the characteristics in the case where magnetic shield plates (type B) made of a permalloy are used; line $A_2$ represents the characteristics where magnetic shield plates (type A) made of pure iron are used; and line $B_2$ represents the characteristics where magnetic shield plates (type B) made of pure iron are used. As is understood from FIG. 8, the magnetic shield plates made of pure iron exhibit a better magnetic shield effect than the magnetic shield plates made of a permalloy, and in addition, as the thickness of the magnetic shield plates is increased, a better magnetic shield effect is obtained.

Figure 9:
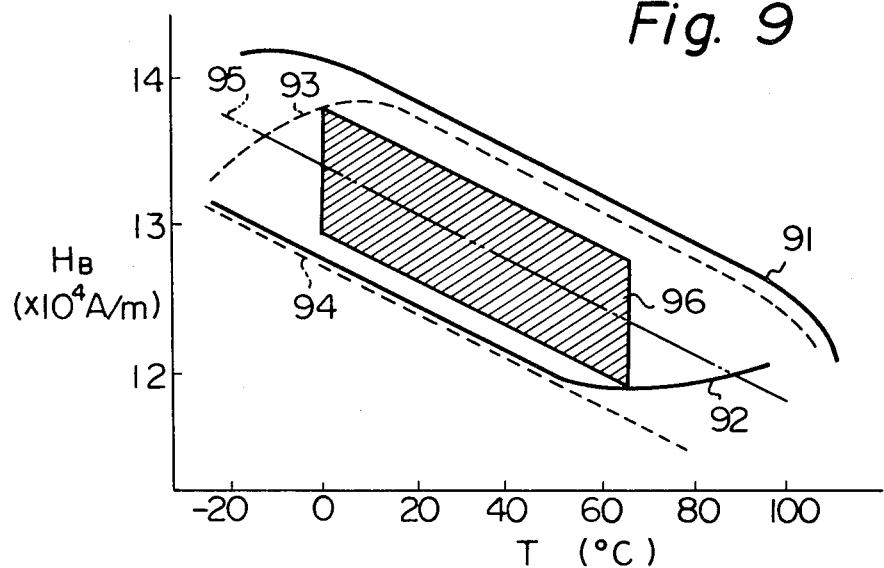
FIG. 9 is a graph illustrating temperature characteristics of the operating margin of a magnetic bubble.

FIG. 9 is a graph used for explaining the temperature characteristics of the operating margin of a magnetic bubble with regard to a magnetic bubble 3 μm in diameter. In FIG. 9, the temperature T is shown in the ordinate, while the bias magnetic field $H_B$ applied to the magnetic bubble is shown in the abscissa. In FIG. 9, an area surrounded by solid lines 91 and 92 represents an operating margin when a magnetic field for driving the magnetic bubble, that is, a rotating magnetic field, is large. In this case, at a high temperature and at a low bias magnetic field, since the replicator 14 (FIG. 1) can easily generate a magnetic bubble, the margin is small. On the other hand, an area surrounded by broken lines 93 and 94 represents an operating margin in the case where a rotating magnetic field is small. In this case, at a low temperature and at a high bias magnetic field, since saturation magnetization ($4\pi M_S$) of the magnetic crystal is increased so that magnetic bubbles easily disappear, the margin is small. Therefore, a shaded area 96 represents a normal operating area. Note that the dot and dash line 95 represents the temperature characteristics of a bias magnetic field. That is, the bias margin of a magnetic bubble is small and dependent upon the temperature. In consideration of the above, it is preferable to hold the magnetic bubble memory chip at a certain temperature. For this purpose, according to the present invention, means for dissipating heat is provided.

Figure 10:
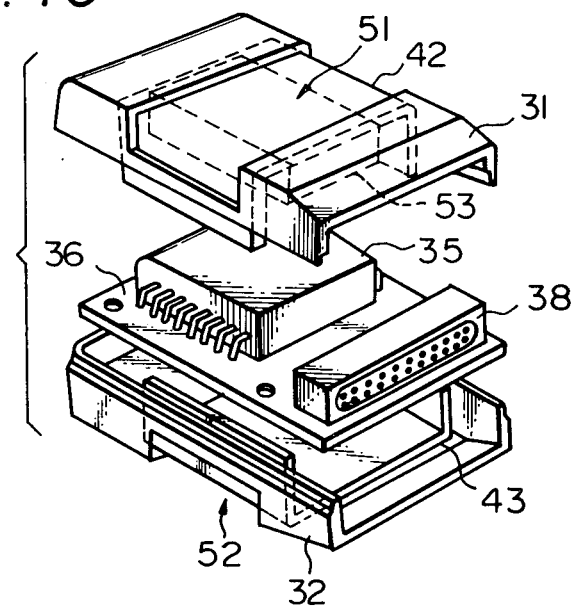
FIG. 10 is an exploded view illustrating another embodiment of the cassette-type magnetic bubble memory device according to the present invention.

FIG. 10 is an exploded view illustrating another embodiment of the cassette-type magnetic bubble memory device (cassette) according to the present invention. In FIG. 10, the elements which are the same as those of FIG. 3 are denoted by the same references. As illustrated in FIG. 10, the upper case 31 and the lower case 32 have apertures 51 and 52, respectively, to expose the outer surfaces of the magnetic shield plates 42 and 43 to the open air. In addition, a plate 53 of a high heat-conductive material, such as aluminium or its alloy is provided. This plate 53 contacts the package 35, which enchances the heat dissipating effect, when the cases 31 and 32 are combined. Note that fins of a high heat-conductive material can be used instead of the plate 53.

Further, it is preferable that the above-mentioned upper and lower cases are made of a mixture containing a carbon material or coated with metal, such as nickel, in order to prevent electrostatic destruction of the memory chip.

As explained hereinbefore, the cassette-type magnetic bubble memory device according to the present invention has an advantage in that an excellent magnetic shield effect is obtained.

We claim:

1. A magnetic bubble memory device of a cassette type, comprising:
   at least one magnetic bubble memory chip and associated peripheral circuits;
   coils, surrounding said magnetic bubble memory chip, for generating a rotating magnetic field for said magnetic bubble memory chip;
   permanent magnets, each positioned on opposite sides of said magnetic bubble memory chip and outside said coils, for generating a bias magnetic field for said magnetic bubble memory chip;
   a magnetic shield case package, encasing said magnetic bubble memory chip, said coils and said permanent magnets, for accommodating said magnetic bubble memory chip, said coils and said permanent magnets;
   a printed board, fixed to said package, for mounting said package and the peripheral circuits;
   upper and lower cases encasing said printed board mounting said package; and
   two magnetic shield plates fixed to the inner faces of said upper and lower cases, respectively.

2. A magnetic bubble memory device as set forth in claim 1, wherein each of said magnetic shield plates has an approximately U-shaped cross-section.

3. A magnetic bubble memory device as set forth in claim 2, wherein said U-shaped magnetic shield plates are superposed at the ends thereof.

4. A magnetic bubble memory device as set forth in claim 1, wherein said magnetic shield plates are made of a permalloy.

5. A magnetic bubble memory device as set forth in claim 1, wherein said magnetic shield plates are made of substantially pure iron.

6. A magnetic bubble memory device as set forth in claim 1, wherein said upper and lower cases are made of a mixture containing a carbon material.

7. A magnetic bubble memory device as set forth in claim 1, wherein both said upper and lower cases have outer surfaces, and the outer surfaces of said upper and lower cases are coated with metal.

8. A magnetic bubble memory device of a cassette type, comprising:
   at least one magnetic bubble memory chip and associated peripheral circuits;
   coils, surrounding said magnetic bubble memory chip, for generating a rotating magnetic field for said magnetic bubble memory chip;
   permanent magnets, each positioned on opposite sides of said magnetic bubble memory chip and outside said coils, for generating a bias magnetic field for said magnetic bubble memory chip;
   a package, encasing said magnetic bubble memory chip, said coils and said permanent magnets, for accommodating said magnetic bubble memory chip, said coils and said permanent magnets;
   a printed board, fixed to said package, for mounting said package and the peripheral circuits;
   upper and lower cases encasing said printed board mounting said package and each having apertures; and
   two magnetic shield plates fixed to the inner faces of said upper and lower cases, respectively, each of said magnetic shield plates has an outer surface and said upper and lower case exposing the outer surfaces of said magnetic shield plates to the open air through the apertures.

9. A magnetic bubble memory device as set forth in claim 8, further comprising heat dissipating means fixed to said magnetic shield plate fixed to said upper case and contacting said package.

10. A magnetic bubble memory device as set forth in claim 9, wherein said heat dissipating means comprises a plate made of a heat-conductive material.

11. A magnetic bubble memory device as set forth in claim 9, wherein said heat dissipating means comprises fins made of a heat-conductive material.

12. A magnetic bubble memory device as set forth in claim 10 or 11, wherein said heat conductive material is aluminium.

13. A magnetic bubble memory device as set forth in claim 10 or 11, wherein said heat-conductive material is an aluminium alloy.

* * * * *

UNITED STATES PATENT AND TRADEMARK OFFICE
CERTIFICATE OF CORRECTION

PATENT NO. : 4,459,680

DATED : July 10, 1984

INVENTOR(S) : TOSHIAKI SUKEDA et al

It is certified that error appears in the above-identified patent and that said Letters Patent is hereby corrected as shown below:

Column 2, line 19, after "6b" insert --,--;
line 23, after "8a" insert --,--.

Column 3, line 29, "can not" should be --cannot--.

Signed and Sealed this

Ninth Day of April 1985

[SEAL]

*Attest:*

DONALD J. QUIGG

*Attesting Officer*  *Acting Commissioner of Patents and Trademarks*